US007415678B2

(12) United States Patent
Gizdarski

(10) Patent No.: US 7,415,678 B2
(45) Date of Patent: Aug. 19, 2008

(54) METHOD AND APPARATUS FOR SYNTHESIS OF MULTIMODE X-TOLERANT COMPRESSOR

(75) Inventor: Emil Gizdarski, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 91 days.

(21) Appl. No.: 11/274,355

(22) Filed: Nov. 15, 2005

(65) Prior Publication Data

US 2007/0113128 A1 May 17, 2007

(51) Int. Cl.
*G06F 17/50* (2006.01)
(52) U.S. Cl. .............................................. 716/1; 716/6
(58) Field of Classification Search ...................... 716/1, 716/2, 5, 18, 6; 714/726, 729
See application file for complete search history.

(56) References Cited

U.S. PATENT DOCUMENTS

| | | | |
|---|---|---|---|
| 3,784,907 A | 1/1974 | Eichelberger | |
| 4,495,629 A | 1/1985 | Zasio et al. | |
| 4,503,537 A | 3/1985 | McAnney | |
| 5,790,562 A | 8/1998 | Murray et al. | |
| 6,557,129 B1 | 4/2003 | Rajski et al. | |
| 6,615,380 B1 | 9/2003 | Kapur et al. | |
| 6,738,939 B2 | 5/2004 | Udawatta et al. | |
| 6,745,359 B2 | 6/2004 | Nadeau-Dostie | |
| 6,748,564 B1 | 6/2004 | Cullen et al. | |
| 6,782,501 B2 | 8/2004 | Distler et al. | |
| 6,829,740 B2 | 12/2004 | Rajski et al. | |
| 6,874,109 B1 | 3/2005 | Rajski et al. | |
| 6,877,119 B2 | 4/2005 | Lauga | |
| 7,058,869 B2 * | 6/2006 | Abdel-Hafez et al. | 714/729 |
| 7,111,209 B2 * | 9/2006 | Rajski et al. | 714/718 |
| 7,231,570 B2 * | 6/2007 | Wang et al. | 714/729 |
| 2002/0093356 A1 | 7/2002 | Williams et al. | |
| 2004/0148554 A1 | 7/2004 | Dervisoglu et al. | |
| 2005/0055617 A1 * | 3/2005 | Wang et al. | 714/727 |
| 2007/0113135 A1 | 5/2007 | Rajski et al. | |

OTHER PUBLICATIONS

Wohl et al. "X-Tolerant Compression and Application of Scan-ATPG Patterns in a BIST Architecture" IEEE ITC International Test Conference 2003, pp. 727-736.
Sitchinava et al. "Changing the Scan Enable During Shift" Proceedings of the 22nd IEEE VLSI Test Symposium 2004, consisting of 6 pages.
Wohl et al. "Scalable Selector Architecture for X-Tolerant Deterministic BIST" DAC Jun. 7-11, 2004 San Diego, CA, pp. 934-939.
Mitra et al. "X-Compact: An Efficient Response Compaction Technique", IEEE Transactions on Computer-Aided Design of Integrated Circuits and Systems, vol. 23, No. 3, Mar. 2004, pp. 421-432.

(Continued)

*Primary Examiner*—Jack Chiang
*Assistant Examiner*—Binh C Tat
(74) *Attorney, Agent, or Firm*—Kenta Suzue; Haynes Beffel & Wolfeld LLP

(57) ABSTRACT

Methods and apparatuses for synthesizing a multimode x-tolerant compressor are described.

19 Claims, 9 Drawing Sheets

| Scan chain | Output Mapping X | Output Mapping Y | Groups/Modes | | | | | | | |
|---|---|---|---|---|---|---|---|---|---|---|
| | | | G0 | G1 | G2 | G3 | M4 | M5 | M6 | M7 |
| 0 | 0 1 2 | 0 1 2 | X | | X | | Y | | | |
| 1 | 0 2 3 | 0 2 3 | X | | | X | | Y | | |
| 2 | 2 4 5 | 2 4 5 | | X | X | | | | Y | |
| 3 | 0 3 5 | 0 3 5 | | X | | X | | | | Y |
| 4 | 0 1 3 | 0 1 3 | X | | X | | Y | | | |
| 5 | 0 2 4 | 0 2 4 | X | | | X | | Y | | |
| 6 | 3 4 5 | 3 4 5 | | X | X | | | | Y | |
| 7 | 1 3 5 | 1 3 5 | | X | | X | | | | Y |
| 8 | 0 1 4 | 0 1 4 | X | | X | | Y | | | |
| 9 | 0 2 5 | 0 2 5 | X | | | X | | Y | | |
| 10 | 1 4 5 | 1 4 5 | | X | X | | | | Y | |
| 11 | 2 3 5 | 2 3 5 | | X | | X | | | | Y |
| 12 | 0 1 5 | 0 1 5 | X | | X | | Y | | | |
| 13 | 1 2 3 | 1 | X | | X | | | Y | | |
| 14 | 0 4 5 | 0 4 5 | | X | X | | | | Y | |
| 15 | 1 2 4 | 4 | | X | | X | | | | Y |

OTHER PUBLICATIONS

Hakmi et al. "Implementing a Scheme for External Deterministic Self-Test" VLSI Test Symposium, 2005, Proceedings 23rd IEEE, May 1-5, 2005, pp. 101-106.

Reddy et al. "A Data Compression Technique for Built-In Self-Test" IEEE Transactions on Computers, vol. 37, No. 9, Sep. 1988, pp. 1151-1156.

Mitra et al. "X-Compact An Efficient Response Compaction Technique for Test Cost Reduction", ITC International Test Conference, 2002, pp. 311-320.

Chickermane et al. "Channel Masking Synthesis for Efficient On-Chip Test Compression" IEEE ITC International Test Conference 2004, pp. 452-461.

Wohl et al. "Analysis and Design of Optimal Combinational Compactors" Proceedings of the 21st IEEE VLSI Test Symposium, 2003, consisting of 6 pages.

Patel et al. "Application of Saluja-Karpovsky Compactors to Test Responses with Many Unknowns", Proceedings of the 21st IEEE VLSI Test Symposium 2003, consisting of 6 pgs.

Rajski et al. "Convolutional Compaction of Test Responses" IEEE ITC International Test Conference, 2003, pp. 745-754.

Rajski et al. "Synthesis of X-Tolerant Convolutional Compactors" Proceedings of the 23rd IEEE VLSI Test Symposium, 2005, consisting of 6 pages.

Saluja et al. "Testing Computer Hardware Through Data Compression in Space and Time" IEEE International Test Conference 1983, pp. 83-88.

Han et al. "Response Compaction for Test Time and Test Pins Reduction Based on Advanced Convolutional Codes" Proceedings of the 19th IEEE International Symposium on Defect and Fault Tolerance in VLSI Systems 2004, consisting of 8 pages.

R. David "Testing by Feedback Shift Register" IEEE Transactions on Computers, vol. C-29, No. 7, Jul. 1980, pp. 668-673.

* cited by examiner

FIG. 1

| Scan chain | Output mapping | G0 | G1 | G2 | G3 | G4 | G5 | G6 | G7 | M8 | M9 | M10 | M11 | M12 |
|---|---|---|---|---|---|---|---|---|---|---|---|---|---|---|
| 0 | 0 2 4 | X | | | | | | | | X | | | | X |
| 1 | 0 3 5 | X | | | | | | | | X | | X | | X |
| 2 | 1 2 5 | X | | | | | | X | | X | | | X | X |
| 3 | 1 3 4 | X | | | | X | | | X | X | | X | X | X |
| 4 | 1 3 5 | | X | | | X | | | | X | X | | | X |
| 5 | 2 3 4 | | X | | | | X | | | X | | X | | X |
| 6 | 0 4 5 | | X | | | | | X | | X | X | X | X | X |
| 7 | 0 1 2 | | X | | | | | | X | | X | | X | X |
| 8 | 3 4 5 | | | X | | X | | | | | X | X | | X |
| 9 | 1 2 4 | | | X | | | X | | | | X | X | X | X |
| 10 | 0 1 3 | | | X | | | | X | | | X | | X | X |
| 11 | 0 2 5 | | | X | | | | | X | | X | X | X | X |
| 12 | 1 2 3 | | | | X | X | | | | | X | X | | X |
| 13 | 0 1 5 | | | | X | | X | | | | X | X | | X |
| 14 | 0 3 4 | | | | X | | | X | | | X | | X | X |
| 15 | 2 4 5 | | | | X | | | | X | | X | | X | X |

Groups/Modes

| Scan chain | Output mapping | Groups/Modes | | | | | | | |
|---|---|---|---|---|---|---|---|---|---|
| | | G0 | G1 | G2 | G3 | G4 | G5 | G6 | G7 |
| 0 | 0 2 4 | X | | | | X | | | |
| 1 | 0 3 5 | X | | | | | X | | |
| 2 | 1 2 5 | X | | | | | | X | |
| 3 | 1 3 4 | X | | | | | | | X |
| 4 | 0 2 4 | | X | | | | | | X |
| 5 | 0 3 5 | | X | | | X | | | |
| 6 | 1 2 5 | | X | | | | X | | |
| 7 | 1 3 4 | | X | | | | | X | |
| 8 | 0 2 4 | | | X | | | | X | |
| 9 | 0 3 5 | | | X | | | | | X |
| 10 | 1 2 5 | | | X | | X | | | |
| 11 | 1 3 4 | | | X | | | X | | |
| 12 | 0 2 4 | | | | X | | X | | |
| 13 | 0 3 5 | | | | X | | | X | |
| 14 | 1 2 5 | | | | X | | | | X |
| 15 | 1 3 4 | | | | X | X | | | |

FIG. 3

| Scan chain | Clock domain | Output mapping X | Output mapping Y | Groups/Modes ||||||| |
|---|---|---|---|---|---|---|---|---|---|---|
| | | | | G0 | G1 | G2 | G3 | G4 | G5 | M6 |
| 0 | A | 0 2 4 | 0 | X | | | | Y | | X |
| 1 | A | 1 3 4 | 1 | X | | | | Y | | X |
| 2 | A | 1 2 5 | 2 | X | | | | Y | | X |
| 3 | A | 0 3 5 | 3 | X | | | | Y | | X |
| 4 | A | 0 4 5 | 4 | | X | | | Y | | X |
| 5 | A | 1 3 5 | 5 | | X | | | Y | | X |
| 6 | A | 0 1 2 | 0 1 | | X | | | | Y | X |
| 7 | A | 2 3 4 | 2 3 | | X | | | | Y | X |
| 8 | A | 3 4 5 | 4 5 | | | X | | | Y | X |
| 9 | B | 0 1 3 | 0 3 | | | X | | | Y | X |
| 10 | B | 1 2 4 | 1 4 | | | X | | | Y | X |
| 11 | B | 0 2 5 | 2 5 | | | X | | | Y | X |
| 12 | C | 1 2 3 | 1 2 | | | | X | | Y | X |
| 13 | C | 0 3 4 | 3 4 | | | | X | | Y | X |
| 14 | C | 0 1 5 | 0 5 | | | | X | | Y | X |
| 15 | D | 2 4 5 | 2 4 | | | | X | | Y | X |

FIG. 4

| Scan chain | Output Mapping X | Output Mapping Y | G0 | G1 | G2 | G3 | M4 | M5 | M6 | M7 |
|---|---|---|---|---|---|---|---|---|---|---|
| 0 | 012 | 012 | X |  | X |  | Y |  |  |  |
| 1 | 023 | 023 | X |  |  | X |  | Y |  |  |
| 2 | 245 | 245 |  | X | X |  |  |  | Y |  |
| 3 | 035 | 035 | X | X |  | X |  |  |  | Y |
| 4 | 013 | 013 | X |  | X | X | Y |  |  |  |
| 5 | 024 | 024 | X |  | X | X |  | Y |  |  |
| 6 | 345 | 345 |  |  | X | X |  |  | Y |  |
| 7 | 135 | 135 | X | X |  | X | Y |  |  | Y |
| 8 | 014 | 014 | X |  | X | X |  |  |  |  |
| 9 | 025 | 025 | X |  |  | X |  | Y |  |  |
| 10 | 145 | 145 |  | X | X | X | Y |  |  |  |
| 11 | 235 | 235 |  | X | X | X |  |  | Y |  |
| 12 | 015 | 015 | X |  | X | X |  | Y |  |  |
| 13 | 123 | 1 | X |  | X | X |  |  |  | Y |
| 14 | 045 | 045 |  | X | X | X |  |  | Y |  |
| 15 | 124 | 4 |  | X | X | X |  |  |  | Y |

FIG. 5

| Scan chains | Clock domain | Outputs | | | | | | | | | | | | | | | | |
|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 | 16 | 17 |
| 0 | A | x | | | | | | | | y | | | | | | | | z | |
| 1 | A | | x | | | | | | | | y | | | | | | | | z |
| 2 | A | | | x | | | | | | | | y | | | | | | z | |
| 3 | A | | | | x | | | | | | | | y | | | | | | z |
| 4 | A | | | | | x | | | | | | | | y | | | | z | |
| 5 | A | | | | | | x | | | | | | | | y | | | | z |
| 6 | A | | | | | | | x | | | y | | | | | | | z | |
| 7 | A | | | | | | | | x | | | | | | | y | | | z |
| 8 | B | x | | | | | | | | | y | | | | | | | z | |
| 9 | B | | x | | | | | | | | | y | | | | | | | z |
| 10 | B | | | x | | | | | | | | | y | | | | | z | |
| 11 | B | | | | x | | | | | | | | | y | | | | | z |
| 12 | B | | | | | x | | | | | | | | | y | | | z | |
| 13 | B | | | | | | x | | | | | | | | | y | | | z |
| 14 | C | | | | | | | x | | | | | | | | | y | z | |
| 15 | C | | | | | | | | x y | | | | | | | | y | | z |

FIG. 6

METHOD AND APPARATUS FOR SYNTHESIS OF MULTIMODE X-TOLERANT COMPRESSOR

BACKGROUND OF THE INVENTION

1. Field of the Invention

The present invention relates to electronic design automation in the integrated circuit industry. Various embodiments relate to testing and diagnosis of integrated circuits and more particularly to test response compaction used in test data volume and test application reduction for integrated circuits.

2. Description of Related Art

Electronic design automation EDA is applied in the semiconductor industry for virtually all device design projects. After an idea for the product is developed, EDA tools are utilized to define a specific implementation. The implementation defined using EDA tools is used to create mask data used for production of masks for lithographic use in the production of the finished chips, in a process referred to as tape-out. The masks are then created and used with fabrication equipment to manufacture integrated circuit wafers. The wafers are diced, packaged and assembled to provide integrated circuit chips for distribution.

An exemplary procedure for design using EDA tools begins with an overall system design using architecture defining tools that describe the functionality of the product to be implemented using the integrated circuit. Next, logic design tools are applied to create a high level description based on description languages such as Verilog or VHDL, and functional verification tools are applied in an iterative process to assure that the high-level description accomplishes the design goals. Next, synthesis and design-for-test tools are used to translate the high-level description to a netlist, optimize the netlist for target technology, and design and implement tests that permit checking of the finished chip against the netlist.

A typical design flow might next include a design planning stage, in which an overall floor plan for the chip is constructed and analyzed to ensure that timing parameters for the netlist can be achieved at a high level. Next, the netlist may be rigorously checked for compliance with timing constraints and with the functional definitions defined at the high level using VHDL or Verilog. After an iterative process to settle on a netlist and map the netlist to a cell library for the final design, a physical implementation tool is used for placement and routing. A tool performing placement positions circuit elements on the layout, and a tool performing routing defines interconnects for the circuit elements.

The components defined after placement and routing are usually then analyzed at the transistor level using an extraction tool, and verified to ensure that the circuit function is achieved and timing constraints are met. The placement and routing process can be revisited as needed in an iterative fashion. Next, the design is subjected to physical verification procedures, such as design rule checking DRC, layout rule checking LRC and layout versus schematic LVS checking, that analyze manufacturability, electrical performance, lithographic parameters and circuit correctness.

After closure on an acceptable design by iteration through design and verify procedures, like those described above, the resulting design can be subjected to resolution enhancement techniques that provide geometric manipulations of the layout to improve manufacturability. Finally, the mask data is prepared and taped out for use in producing finished products.

This design process with EDA tools includes circuitry that allows the finished product to be tested. Efficient testing of integrated circuits often uses structured design for testability (DFT) techniques. In particular, these techniques are based on the general concepts of making all or some state variables (memory elements like flip-flops and latches in the circuit) directly controllable and observable. The most-often used DFT methodology is based on scan chains. This approach assumes that during testing all (or almost all) memory elements are connected into one or more shift registers, as shown in U.S. Pat. No. 4,503,537. As a result, the designed logic circuit has two or more modes of operation: a normal mode and a test, or scan, mode. In the normal mode, the memory elements perform their regular functions. In the scan mode, the memory elements become scan cells that are connected to form a number of shift registers called scan chains. These scan chains are used to shift test data into the circuit under test and shift out test responses. Applying a test pattern consists of scanning in the test stimulus, applying one or more functional clocks, and then scanning out the captured response. The test responses are then compared to fault-free test responses to determine whether the circuit under test (CUT) works properly.

Scan design methodology has been widely used in order to simplify testing and diagnosis. From the point of view of automatic test pattern generation (ATPG), a scan circuit can be treated as a combinational or partially combinational circuit. Today, ATPG software tools are able to generate a complete set of test patterns based on different fault models including stuck-at, transition, path delay, and bridging faults. Typically, when a particular potential fault in a circuit is targeted by an ATPG tool, only a small number of scan cells must be specified and a single scan cell needs to be observed in order to detect the particular fault. Usually, the remaining scan cells are filled with random values. In this way, the test pattern is fully specified and could detect some additional untargeted faults.

Although just a few scan cells need to be observed to detect some set of target faults for each test pattern, full operability of all scan chains is a quite desirable property for both testing and diagnosis in order to achieve high test coverage of unmodeled defects as well higher accuracy and precision in defect localization during diagnosis.

The number of test patterns and scan chains are limited by such factors as available chip I/O, available tester channels and memory, and on-chip routing congestion. Because of the growing complexity and density of the integrated circuit, reducing test data volume and test application time has become a key issue for increasing quality and reducing test costs. By utilizing decompressor circuitry at the scan chain inputs and compressor circuitry at the scan chain outputs, these testing limitations are partly alleviated. Some of the DFT techniques for test data volume and test application time reduction use a compressor design based on linear code theory and convolutional code theory to compress the test responses from the scan chains. For example, linear compactors are built of exclusive-OR (XOR) or exclusive-NOR (XNOR) gates to reduce the number of test outputs of the integrated circuit. However, compactors may also mask errors in test responses from an integrated circuit. For example, the basic characteristic an XOR (parity) tree is that any combination of odd number of errors on its inputs propagates to their outputs, and any combination of even number of errors remains undetected.

Accordingly, a goal of compressor design is for a combinational block to meet the following requirements: (1) easy to specify and implement, (2) low area overhead with low impact on the integrated circuit, (3) logarithmic compression ratio, and (4) simple and reliable mechanism for error detection and location. However, satisfying all these requirements is quite challenging. In particular, it is difficult to ensure that the compressed test responses obtained from a faulty circuit are not the same as that of a fault-free circuit. This phenomenon is known as error masking or aliasing. An example of error masking occurs when the compactor reads multiple errors at the same time. The multiple errors could mask one another, resulting in a compressed test response that is the same as the compressed test response for a fault-free circuit.

Unknown values also add some complexity in error detection and location. For example, an unknown value on one or more inputs of an XOR tree generates unknown values on its output, and consequently masks propagation of errors on other inputs. This phenomenon is known as x-masking.

Thus, compressor design is challenging because of these conflicting requirements. It would be desirable, therefore, to provide an efficient compressor that generates a valid compressed test response even when unknown values or multiple errors exist on its inputs, and allowed for efficient and reliable detection and location of multiple errors in the test response for the purposes of testing and diagnosis.

SUMMARY OF THE INVENTION

Disclosed are various methods of compressing test responses of a circuit under test. The circuit under test has scan chains including known scan chains and unknown scan chains. A compressor circuit of the circuit under test is synthesized according to a selection from compressor design strategies. The selection may be by a user or be autonomous. The compressor design strategies have a varying sensitivity to a quantity of unknown values appearing in the test responses of the circuit under test. The compressor circuit being synthesized selectively compresses the test responses from groups of scan chains and shift cycles by at least mapping the scan chains into the outputs, mapping the scan chains into groups of scan chains, and mapping the scan chains into modes. In various embodiments, the scan chains are mapped into at least two groups of scan chains.

Multiple configurations are included in some of the compressor design strategies to reduce the x-masking effect. In one approach, each configuration is associated with a set of modes and specifies a mapping of a subset of the groups of scan chains into the scan chains. In another approach, each configuration is associated with a set of modes and specifies a mapping of the scan chains into the outputs.

Particular mode selections are included in some of the compressor design strategies. The mode selection can be received via one or more test protocols during testing. The mode selection includes a set of available modes for each test protocol, and includes a partition on the set of available modes into one or more subsets of compatible modes appearing in the shift cycles of each test pattern generated based on each test protocol.

In another approach, the compressor circuit is synthesized to include fully combinational control to increase the degree of freedom for a mode selection during testing. The mode selection includes a set of available modes for each test protocol and includes a partition on the set of available modes into one or more subsets of compatible modes appearing in the shift cycles of each test pattern generated based on each test protocol.

Some embodiments include a mode, whereby the test responses coming from all scan chains are selected for compression. Some embodiments include a mode, whereby no test responses coming from any scan chain are selected for compression.

A varying sensitivity to unknown values is exhibited in various compressor design strategies.

For example, by mapping the known scan chains into a set of known groups, such that for each known group of the set of known groups, when at least one unknown value in test responses from each such known group exists, an error in test responses from each such known group is detectable by analyzing a compressed representation of the test responses. The error and this at least one unknown value occur in a same shift cycle.

In another example, by mapping the known scan chains into a set of known groups, such that for each known group of the set of known groups, when at least two unknown values in test responses from each such known group exist, an error in test responses from each such known group is detectable by analyzing a compressed representation of the test responses. The error and these at least two unknown values occur in a same shift cycle.

In yet another example, by mapping the known scan chains into a set of known groups, such that for each known group of the set of known groups, an error in test responses from each such known group is detectable by analyzing a compressed representation of the test responses, regardless of two unknown values in test responses from any such unknown group. The error and these at least two unknown values occur in a same shift cycle. The set of scan chains is in a same clock domain.

In a further example, by mapping the unknown scan chains into a set of unknown groups, such that for each unknown group of the set of unknown groups, an error in test responses from each such unknown group is detectable by analyzing a compressed representation of the test responses, regardless of any unknown values in test responses from each such unknown group. The error and any such unknown values occur in a same shift cycle.

In yet another example, by mapping the unknown scan chains into a set of unknown groups, such that for each unknown group of the set of unknown groups, an error in test responses from each such unknown group is detectable by analyzing a compressed representation of the test responses, regardless of any unknown values in test responses from each such unknown group. The error and any such unknown values occur in a same shift cycle. The set of scan chains is in a same clock domain.

Some embodiments further include: during testing, generating a subset of test patterns to detect a set of faults in the circuit under test targeting fault detection in a set of more restrictive modes for observing particular scan chains of interest; identifying positions of unknown values in the test responses by simulating the subset of the test patterns; and selecting a mode to detect any single error in a set of test responses in one shift cycle targeting fault detection in a set of less restrictive modes for observing the particular scan chains of interest.

Some embodiments further include: during testing, generating a subset of test patterns to detect a set of faults in the circuit under test by observing a set of test responses of interest; identifying positions of unknown values in the test responses by simulating the subset of the test patterns; and selecting a mode to detect an error in the set of test responses of interest in one shift cycle. Such embodiments can further include suspending clock pulses of a first set of scan chains in a first set of clock domains to increase the error detection capability in a second set scan chains in a second set of clock domains.

Further embodiments include a computer readable medium with computer instructions to perform the technology described herein, and a computer apparatus with a computer to perform a method of compressing test responses of a circuit under test as described herein.

BRIEF DESCRIPTION OF THE DRAWINGS

FIG. 1 shows a compressor circuit specification.

FIG. 3 shows a specification for a compressor circuit having scan chain groups with the same output mapping.

FIG. 4 shows a specification for a compressor circuit with scan chains distributed into multiple clock domains.

FIG. 5 shows an example of constructing shrinking modes.

FIG. 6 shows a specification for another compressor circuit with scan chains distributed into multiple clock domains.

DETAILED DESCRIPTION

Figure 2B:
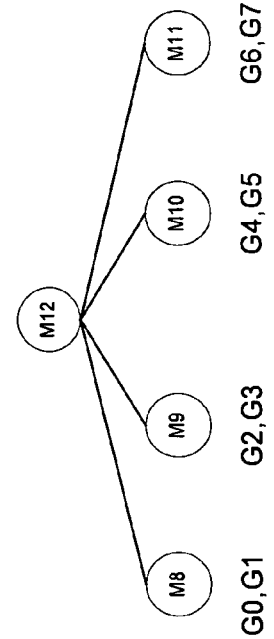
FIGS. 2A-2E show different mode selections for the compressor circuit of FIG. 1.

A tester is coupled to an integrated circuit having a circuit under test, input selector, and hierarchical compactor. In addition, the input selector has control logic; AND, NAND, OR and/or NOR gates; and/or MUX gates. The compactor has XOR and/or NXOR gates. The circuit under test has N scan chains partitioned in one or more clock domains. Each scan chain has one or more scan cells belonging to the same clock domain. A scan cell is considered as a source of unknown values if it is likely to be set in an unknown value when the corresponding clock is activated. Based on this terminology, scan chains are classified into known scan chains and unknown scan chains, such that most of the sources of unknown values are located in the unknown scan chains.

Scan chains are mapped into one or more groups of scan chains. In addition, the groups of scan chains can be expanded so that two or more groups of scan chains are selected for compression in one mode. The groups of scan chains may overlap one another and each set of non-overlapping groups of scan chains forms a configuration.

Each scan chain is observable in at least one mode, and at a set of one or more outputs of the compressor circuit. This set of outputs is unique for each mode where this scan chain is observable. In one mode, the test responses coming from one or more groups of scan chains are selected for compression in one shift cycle. In another mode, the test responses coming from an intersection of two or more groups of scan chains are selected for compression in one shift cycle.

The current mode is determined by one or more control pins coupled to the tester. The mode can be changed for each shift cycle during the load/unload operation (control per shift) while some (or all) control pins can be changed for each test pattern (control per test). As a result, all modes cannot be used within one test pattern. The compactor is hierarchical and has two or more compactors, each one associated with a particular group of scan chains.

Each compactor within the multimode x-tolerant compressor is designed so that certain desirable properties are satisfied (or maximized) with respect to the corresponding group of scan chains.

For example, the desirable property of the compactors with respect to known scan chains is to tolerate any two unknown values in one shift cycle. In other words, each single error in test responses coming from the known scan chains will produce a compressed test response at the outputs of the compressor circuit that is different than the compressed fault-free test response even when the error and any two unknown values exist in test responses coming from the scan chains in one group and in one shift cycle.

In another example, the desirable property of the compactors with respect to unknown scan chains is to tolerate any number of unknown values in one shift cycle. In other words, each single error in test responses coming from the unknown scan chains will produce a compressed test response at the outputs of the compressor that is different than the compressed fault-free test response even when the error and unknown values exist in test responses coming from the unknown scan chains in one group and in one shift cycle.

This desirable property can be achieved if each unknown scan chain in the corresponding group of scan chains has at least one unique output. In this case, the maximum number of the unknown scan chains in one group of scan chains is equal to, or smaller than, M where M is the number of the outputs.

In addition, two different strategies (mechanisms) are used with respect to the known (and unknown) scan chains to improve the capabilities of the compressor circuit to tolerate unknown values in test responses.

With respect to the known scan chains, the utilized strategy involves using multiple configurations. As a result, if each scan chain is observable at K outputs then more than K−1 unknown values in test responses from the known scan chains in one shift cycle can be tolerated.

With respect to both the unknown scan chains and the known scan chains, the utilized strategy involves using clock domains and an assumption that if one clock domain is inactive then all test responses coming from this clock domain are in a known value. (This assumption is true because the unloaded test responses from all scan chains in all inactive clock domains will be the same as the loaded test data which are known). Based on this assumption, the maximum number of scan chains in one group when satisfying the desirable property could be increased for the circuits having many clock domains (The probability of unknown values during testing may significantly increase for complex circuits having many clock domains).

For example, if each scan chain is observable at K outputs then to achieve the desirable property of tolerating any number of unknown values in one group of scan chains, the maximum number of the unknown scan chains in one group and in one clock domain will be:

Case K=1, equal to M where M is the number of outputs (see Example 3, group G4).

Case K>1 using an unique output, equal to M−K (see Example 4, modes M4-M7).

Case K>1 using an unique pair (x,y) of outputs, equal to (M−K+2)/2 where the maximum number of scan chains in one group will be (M−K+2)(M−K+1)/2 (see Example 3, group G5 and Example 5, group G0).

In addition, a group of scan chains may contain both unknown scan chains and known scan chains when K>1. In this case, the desirable property with respect to the unknown scan chains can be achieved even when one unknown value exists in the test responses coming from the known scan chains in one shift cycle if each unknown scan chain has an unique pair (x,y) of outputs with respect to all other scan chains in this group of scan chains.

For example, when K=3, this condition can be satisfied by excluding some forbidden combinations (x,y,~z) of three outputs. Since (x,y) is an unique pair of outputs where each unknown scan chain is observable with respect to all other scan chains in this group of scan chains, there is no another scan chain observable at outputs (x1,y1,z1) in this group of scan chains that could mask a single error at both outputs x and y at the same time.

The following examples are specific non-limiting examples illustrating various features of the technology. Only a subset of features demonstrated in a single example may be in an embodiment of the technology. An embodiment of the technology may include features from multiple examples.

EXAMPLE 1

FIG. 1 shows a functional specification of a compressor circuit of a circuit under test having 16 scan chains where output mapping specifies a combination of three outputs for each scan chain 0-15 is observable. The compressor circuit being synthesized can be viewed as a hierarchical compressor with one or more compactors, each one of the compactors associated with one group of scan chains such that certain desirable properties are maximized with respect to each group of scan chains. In the particular case of FIG. 1, compactors associated with groups of scan chains G0-G3 tolerate any 2 unknown values in the test responses coming from the corresponding group of scan chains while compactors associated with groups of scan chains G4-G7 tolerate any one unknown value in the test responses coming from the corresponding group of scan chains.

Also, the compressor circuit has 2 configurations associated with primary modes M0-M3 and expanding modes M8 and M9 (a set of groups of scan chains G0-G3) and primary modes M4-M7, and expanding modes M10 and M11 (a set of groups of scan chains G4-G7), respectively. In general, configurations provide a mechanism for avoiding the x-masking effect by observing each scan chain in two or more different groups of scan chains. In the presented example, the number of scan chains belonging to one group of scan chains in both configurations is 1. For example, scan chain 0 is observable together with scan chains 1, 2 and 3 in group G0 and together with scan chains 4, 8 and 12 in group G4. As a result, scan chain 0 is the only scan chain belonging to one group of scan chains in both configurations. This condition is valid for each scan chain 0-15. As a result, the number of unknown values tolerated by the compressor circuit being synthesized can be calculated by formula (T1+T2+1) wherein T1 and T2 is the number of unknown values that can be tolerated with respect to the groups in the first and second configuration respectively. Based on this formula, the number of unknown values that can be tolerated by the specified compressor circuit is 4.

In addition, the compressor circuit allows each group of scan chains G0-G7 associated with modes M0-M7 respectively to be expanded in a way such that two or more groups of scan chains are selected for compression in expanding modes M8-M12. This approach provides a mechanism for ATPG tool to increase the observability of the circuit under test if a distribution of unknown values in the test responses in one shift cycle allows for preventing the x-masking effect for scan cells that need to be observed.

The ATPG tool applies the aforementioned criteria when choosing a mode for each shift cycle in the following sequence: (1) generate the test pattern for a set of faults and determine scan cells that need to be observed under an assumption that at most one group of scan chains can be selected for compression for each shift cycle; (2) simulate test pattern and identify the distribution of the unknown values; (3) for each shift cycle, choose a mode trying to avoid the x-masking effect for as many as possible scan cells that need to be observed; (4) improve observability if possible by selecting expanding modes where more than one group is selected for compression without masking any test responses coming from scan cells that need to be observed.

Figure 2D:
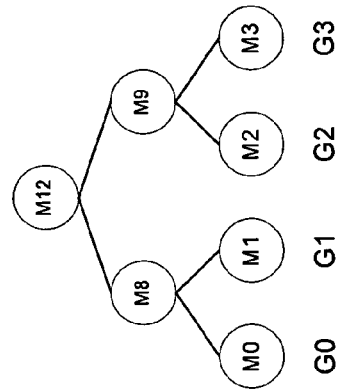
Figure 2A:
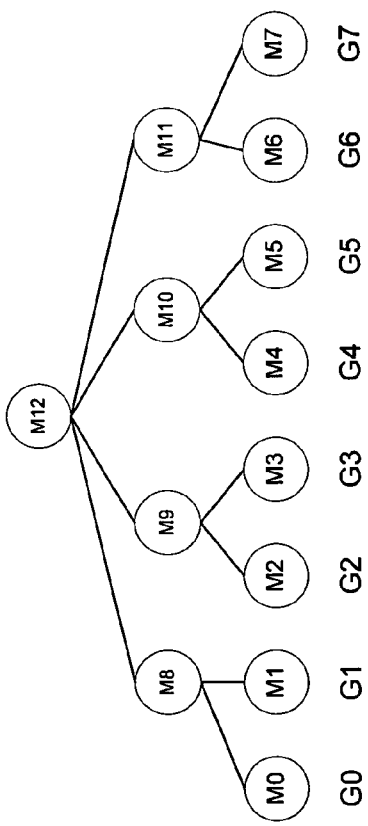
Figure 2C:
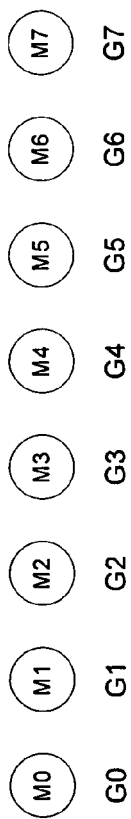
Figure 2E:
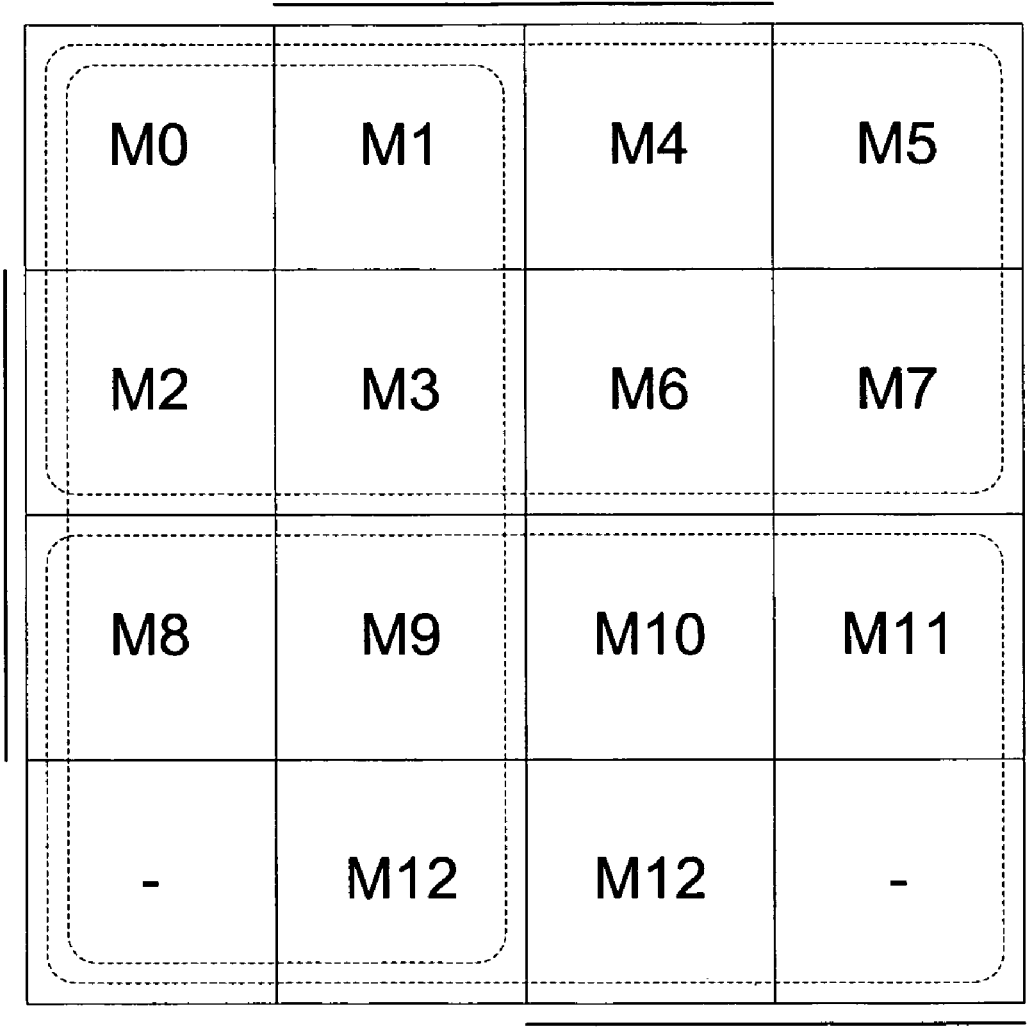

Since the number of modes in the presented example is 13, the number of necessary control pins for a mode selection is 4. The degree of freedom for mode selection is determined during synthesis of the compressor circuit by choosing the number of groups and the number of configurations under the assumption that the value of each control pin can be changed for each shift cycle (control-per-shift). During testing, the mode selection is determined for a set of test patterns by test protocol specifying for each control pin one of these options: control-per-shift, control-per-test, or fixed value for all test patterns generated by the ATPG tool based on this test protocol. This approach provides a mechanism for reducing control test data. As a result, some modes of the compressor circuit are disabled for the ATPG tool or defined as incompatible and cannot appear in the same test pattern. For example, assuming a combinational control logic of the compressor circuit, a variety of options <ssss> . . . <00ts> . . . <1100> can be specified by the test protocol during testing where <ssss> means that all 13 modes are available for both each test pattern and each shift cycle, while <00ts> means that available modes are {0000, 0001, 0010, 0011}, and sets of compatible modes are {0000, 0001} and {0010, 0011}. In this case, ATPG tool chooses one set of compatible modes for each test pattern and is restricted to use these sets of compatible modes for each shift cycle within one test pattern. Also, <1100> means that only mode M12 is available. As a result, the mode selection mechanism is deactivated and test responses coming from all scan chains are selected for compression. FIG. 2A shows the mode selection without restrictions for the compressor circuit specified by FIG. 1. In this case, all 13 modes, M0-M12, are available. FIGS. 2B-2D show some options for the mode selection by fixing one control pin for all test patterns generated based on a particular test protocol. This result can be achieved by a proper coding for the modes during synthesis of the integrated circuit as shown in FIG. 2E.

EXAMPLE 2

FIG. 3 shows a functional specification of a compressor circuit, such that groups of scan chains G0-G7 have the same output mapping. As a result, each group has to be independently selected for compression. This approach allows reducing the area overhead in the compressor circuit but does not allow full observability. In this particular case, the compressor circuit being synthesized has the capability of tolerating any 5 unknown values by using two configurations associated with modes M0-M3 and M4-M7, respectively. In this sense, this approach provides a trade off between the area overhead and the observability for designs having a large number of unknown values. The output mapping for scan chains 0-3 is shown in bold to highlight the fact that the same set of four combinations of outputs is used for observing each group of scan chains.

EXAMPLE 3

FIG. 4 shows a functional specification of a compressor circuit. Accordingly, the circuit under test has 16 scan chains distributed in four clock domains, clock domains A, B, C and D. In this case, all scan chains are treated both as known scan chains in modes M0-M3 and unknown scan chains modes M4-M5 based on using 2 different output mappings X and Y. As a result, the compressor circuit tolerates any two unknown values in one shift cycle for modes M0-M3. The compressor circuit tolerates any number of unknown values in one shift cycle for mode M4 and any number of unknown values in one shift cycle and one clock domain for mode M5. In general, the notation G# is used for a primary mode corresponding to one group while the notation M# is used for expanding and shrinking modes associated with more than one group.

EXAMPLE 4

FIG. 5 shows a functional specification of a compressor circuit. Accordingly, two configurations are specified by groups of scan chains G0-G1 and G2-G3 and two configurations are specified by output mappings X and Y. Also, four shrinking modes M4-M7 are defined as an intersection of groups of scan chains G0-G1 and G2-G3. Output mappings are constructed by treating scan chains in the shrinking modes as unknown scan chains. As a result, the compressor circuit being synthesized tolerates any number of unknown values in one shift cycle and can provide full observability.

EXAMPLE 5

FIG. 6 shows 16 combinations (x,y,z) of three outputs for 16 unknown scan chains distributed in three clock domains A, B and C of an integrated circuit having M=18 outputs. Based on this output mapping, 240, or 16(M−3), forbidden combinations (x,y,~z) have to be excluded from group of scan chains G0 to ensure that each one of the unknown scan chains has an unique pair (x,y) of 2 outputs. The number of available combinations for mode M0 can be calculated as the number of all possible combinations (x,y,z) of three outputs minus the number of all forbidden combinations, or M(M−1)(M−2)/6−240=576. As a result, any single error in an unknown scan chain in a particular clock domain can be localized by analyzing the compressed representation of test responses at the outputs of the integrated circuit when one unknown value exists in the known scan chains selected for compression in mode M0 and any number of unknown values exist in the unknown scan chains in the particular clock domain wherein both the error and the unknown values are in same shift cycle.

Figure 7:
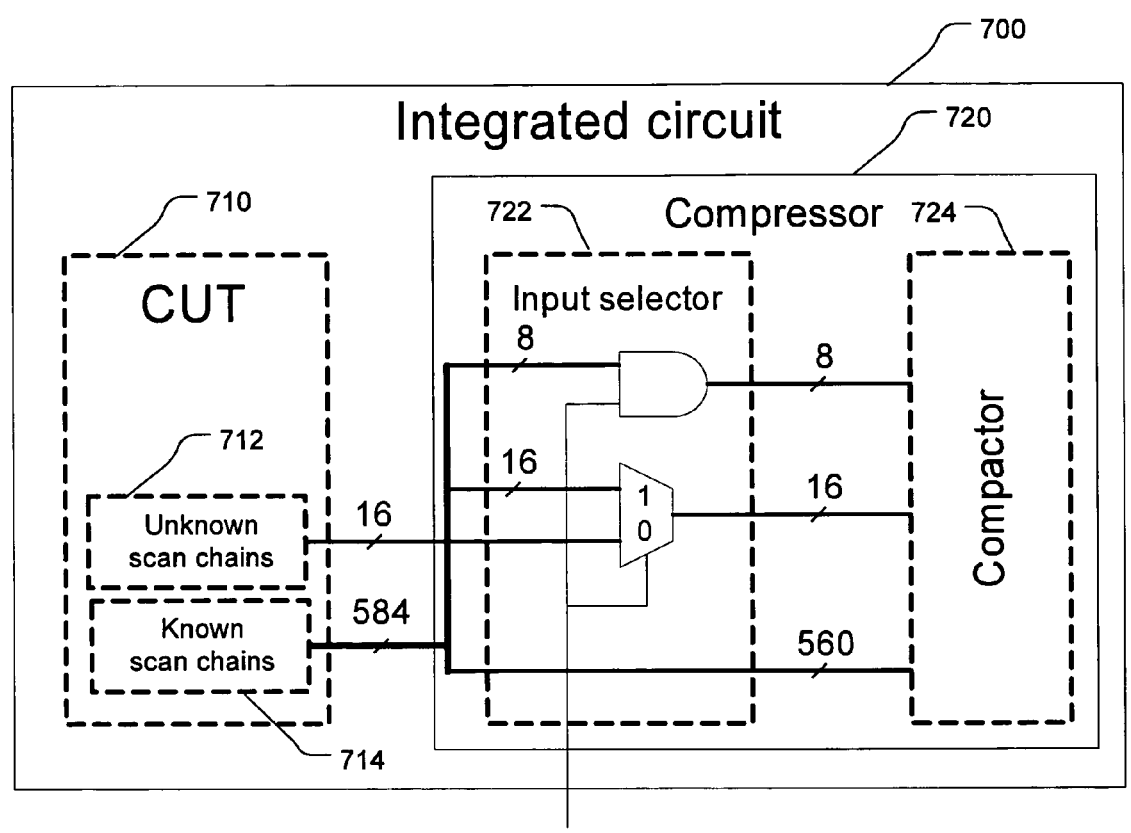
FIG. 7 shows an example integrated circuit synthesized with a multimode x-tolerant compressor circuit as described herein.

FIG. 7 shows a block diagram of an integrated circuit 700 synthesized based on this approach. Accordingly, the integrated circuit 700 has a circuit under test 710 and a compressor circuit 720 including an input selector 722 coupled to a compactor 724. The circuit under test 710 includes scan chains divided into 2 groups, unknown scan chains 712 and known scan chains 714. More precisely, group G0 includes 16 unknown scan chains and 560 known scan chains and group G1 includes 584 known scan chains. As a result, an area overhead of the proposed approach for increasing x-tolerance of the compressor is 16 MUX's and 8 AND gates in the input selector.

The above examples show that scan chain partitioning into known and unknown scan chains is not fixed and a scan chain could be treated as a known or an unknown scan chain in different modes (see Examples 3 and 4). Also, a group of scan chains may contain both known and unknown scan chains (see Example 5, mode M0).

The above examples presented two different approaches for reducing the x-masking effect based on multiple output mappings using different number outputs for observing one scan chain and multiple configurations using scan chain partitioning without overlapping in a way that the number of scan chains belonging to a same group of scan chains in different configurations is minimized. Various embodiments also feature using output mappings having a same number of outputs for observing one scan chain or using scan chain partitioning with overlapping.

In the above examples, the mode selection mechanism assumes combinational control logic and using test protocols to determine the mode selection during testing. Various embodiments also feature control logic with memory elements or using an alternative approach for specifying the mode selection.

The diagram of the integrated circuit consisting of control logic, compressor circuit, input selector and one or more compactors is an example implementation of the presented method and the actual implementation may differ. Some of the above mentioned blocks could be separated or excluded as parts of the integrated circuit implementing the described technology.

Figure 8:
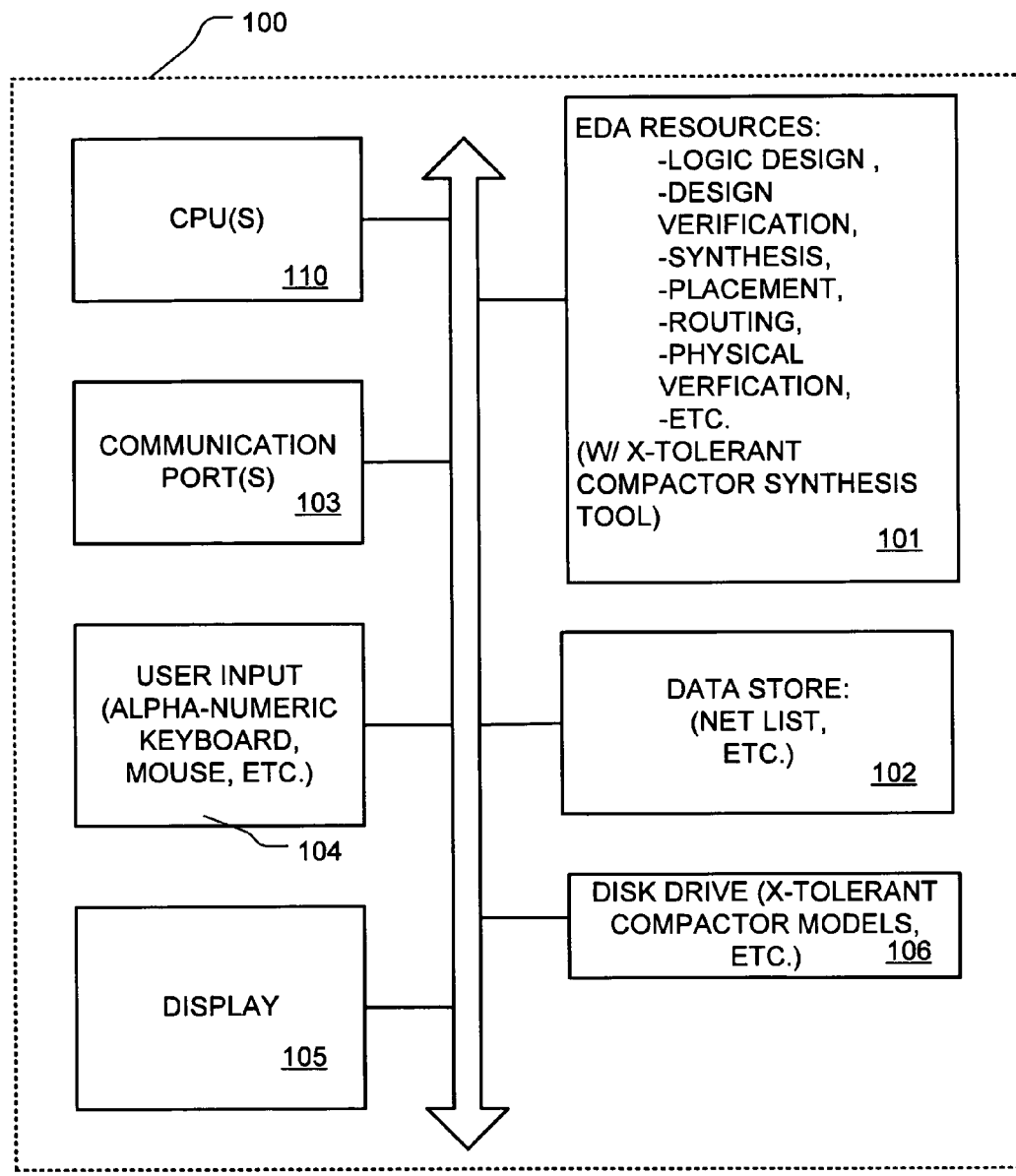
FIG. 8 shows an example of computer resources used to synthesize a multimode x-tolerant compressor circuit as described herein.

FIG. 8 is a simplified block diagram of a data processing system 100 arranged as an electronic design automation system implementing the multimode x-tolerant compressor described herein. The system 100 includes one or more central processing units 110, which are arranged to execute computer programs stored in program memory 101, access a data store 102, access large-scale memory such as a disk drive 106, and to control communication ports 103, user input devices 104, and a display 105. Electronic design automation systems as represented by FIG. 7 include a single workstation, and networks of computers utilized by designers of integrated circuits.

The electronic design automation uses data processing resources including logic implemented as computer programs stored in memory 101 for an exemplary system. In alternatives, the logic can be implemented using computer programs in local or distributed machines, and can be implemented in part using dedicated hardware or other data processing resources. The logic in a representative electronic design automation system includes logic design tools, design verification tools, synthesis tools, placement tools, routing tools, physical verification tools and so on. The resources include a multimode x-tolerant compressor synthesis tool as described herein.

The data store 102 is typically used for storing machine-readable definitions of circuits, such as high-level description language descriptions, netlists, mask definitions and so on. Different multimode x-tolerant compressor designs with varying degrees of x-tolerance are stored here.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of compressing test responses of a circuit under test, the circuit under test including a plurality of scan chains which includes a plurality of known scan chains and a plurality of unknown scan chains, the method comprising:

synthesizing a compressor circuit of the circuit under test according to a selection from a plurality of compressor design strategies, the plurality of compressor design strategies having a varying sensitivity to a quantity of unknown values i) appearing in the test responses of the circuit under test and ii) being compressed; and the compressor circuit being synthesized performing:

mapping the plurality of scan chains into a plurality of groups of scan chains;

mapping the plurality of scan chains into a plurality of modes, wherein in one of the plurality of compressor design strategies said plurality of modes has at least two mode types, including:
  primary modes associated with one group of scan chains of the plurality of groups of scan chains;
  shrinking modes associated with an intersection of two or more groups of scan chains of the plurality of groups of scan chains;
  in at least one mode of the plurality of modes, selectively compressing the test responses from the plurality of groups of scan chains and a plurality of shift cycles by at least mapping the plurality of scan chains into a plurality of outputs of the compressor circuit, such that each of the scan chains is observable at more than one output of the plurality of outputs of the compressor circuit;
  during testing, generating a subset of test patterns to detect a set of faults in the circuit under test targeting fault detection in a set of more restrictive modes of the plurality of modes wherein no more than one group of scan chains is selected for compression in each of the more restrictive modes;
  identifying positions of unknown values in the test responses by simulating the subset of the test patterns; and
  selecting a mode of the plurality of modes to detect any single error in test responses in one shift cycle of the plurality of shift cycles targeting fault detection in a set of less restrictive modes of the plurality of modes wherein one or more groups of scan chains are selected for compression in each of the less restrictive modes.

2. The method of claim 1, wherein one of the plurality of compressor design strategies includes:
  synthesizing the compressor circuit to include a plurality of configurations, wherein each configuration of the plurality of configurations is associated with a set of modes of the plurality of modes and specifies a mapping of a subset of said groups of scan chains into the plurality of scan chains.

3. The method of claim 1, wherein one of the plurality of compressor design strategies includes:
  synthesizing the compressor circuit to include a plurality of configurations, wherein each configuration of the plurality of configurations is associated with a set of modes of the plurality of modes and specifies a mapping of the plurality of scan chains into the plurality of outputs.

4. The method of claim 1, wherein one of the plurality of compressor design strategies includes:
  synthesizing the compressor circuit to receive a mode selection via one or more test protocols during testing, wherein the mode selection includes a set of available modes of the plurality of modes for each test protocol and includes a partition on said set of available modes into one or more subsets of compatible modes appearing in the plurality of shift cycles of each test pattern generated based on each test protocol.

5. The method of claim 1, wherein one of the plurality of compressor design strategies includes:
  synthesizing the compressor circuit to include fully combinational control to increase the degree of freedom for a mode selection during testing, wherein the mode selection includes a set of available modes of the plurality of modes for each test protocol and includes a partition on said set of available modes into one or more subsets of compatible modes appearing in the plurality of shift cycles of each test pattern generated based on each test protocol.

6. The method of claim 1, wherein one of the plurality of compressor design strategies includes:
  synthesizing the compressor circuit to specify a mode of the plurality of modes wherein the test responses coming from all scan chains of the plurality of scan chains are selected for compression.

7. The method of claim 1, wherein one of the plurality of compressor design strategies includes:
  synthesizing the compressor circuit to specify a mode of the plurality of modes wherein no test responses coming from any scan chains of the plurality of scan chains are selected for compression.

8. The method of claim 1, wherein one of the plurality of compressor design strategies includes:
  synthesizing the compressor circuit to map the plurality of scan chains into at least two groups of scan chains and to map the plurality of known scan chains into a set of known groups, such that for each known group of the set of known groups, when at least one unknown value in test responses from said each known group exists, an error in test responses from said each known group is detectable by analyzing a compressed representation of the test responses,
  wherein the error and said at least one unknown value occur in a same shift cycle of the plurality of shift cycles.

9. The method of claim 1, wherein one of the plurality of compressor design strategies includes:
  synthesizing the compressor circuit to map the plurality of scan chains into at least two groups of scan chains and to map the plurality of known scan chains into a set of known groups, such that for each known group of the set of known groups, when at least two unknown values in test responses from said each known group exist, an error in test responses from said each known group is detectable by analyzing a compressed representation of the test responses,
  wherein the error and said at least two unknown values occur in a same shift cycle of the plurality of shift cycles.

10. The method of claim 1, wherein one of the plurality of compressor design strategies includes:
  synthesizing the compressor circuit to map the plurality of known scan chains into a set of known groups, such that for each known group of the set of known groups, an error in test responses from said each known group is detectable by analyzing a compressed representation of the test responses, regardless of two unknown values in test responses from any said each known group,
  wherein the error and said two unknown values occur in a same shift cycle of the plurality of shift cycles, and wherein the error and said two unknown values occur in a set of scan chains of the plurality of known scan chains, and
  wherein the set of scan chains is in a same clock domain.

11. The method of claim 1, wherein one of the plurality of compressor design strategies includes:
  synthesizing the compressor circuit to map the plurality of scan chains into at least two groups of scan chains and to map the plurality of unknown scan chains into a set of unknown groups, such that for each unknown group of the set of unknown groups, an error in test responses from said each unknown group is detectable by analyzing a compressed representation of the test responses, regardless of any unknown values in test responses from said each unknown group, wherein the error and said any unknown values occur in a same shift cycle of the plurality of shift cycles.

12. The method of claim 1, wherein one of the plurality of compressor design strategies includes:
synthesizing the compressor circuit to map the plurality of unknown scan chains into a set of unknown groups, such that for each unknown group of said set of unknown groups, an error in test responses from said each unknown group is detectable by analyzing a compressed representation of the test responses, regardless of any unknown values in test responses from said each unknown group,
wherein the error and said any unknown values occur in a same shift cycle of the plurality of shift cycles, and
wherein the error and said any unknown values occur in a set of scan chains of the plurality of unknown scan chains, and
wherein the set of scan chains is in a same clock domain.

13. The method of claim 1, further comprising:
during testing, generating a subset of test patterns to detect a set of faults in the circuit under test by observing a set of test responses of interest;
identifying positions of unknown values in the test responses by simulating the subset of the test patterns; and
selecting a mode of the plurality of modes to detect an error in the set of test responses in one shift cycle.

14. The method of claim 13, further comprising:
suspending clock pulses of a first set of scan chains of the plurality of scan chains in a first set of clock domains to increase the error detection capability in a second set of the plurality of scan chains of the plurality of scan chains in a second set of clock domains.

15. The method of claim 1, wherein the selection is by a user.

16. The method of claim 1, wherein the selection is autonomous.

17. The method of claim 1, wherein the compressor circuit being synthesized further performs:
partitioning the plurality of outputs of the compressor circuit into a plurality of groups of compressor outputs; and
mapping the plurality of scan chains into the plurality of groups of compressor outputs, such that each scan chain of the plurality of scan chains has a corresponding group of compressor outputs in the plurality of groups of compressor outputs,
such that each scan chain of the plurality of scan chains is observable from at least one compressor output of the corresponding groups of compressor outputs.

18. A computer readable medium, comprising:
computer instructions to perform a method of compressing test responses of a circuit under test, the circuit under test including a plurality of scan chains which includes a plurality of known scan chains and a plurality of unknown scan chains, the method comprising:
synthesizing a compressor circuit of the circuit under test according to a selection from a plurality of compressor design strategies, the plurality of compressor design strategies having a varying sensitivity to a quantity of unknown values i) appearing in the test responses of the circuit under test and ii) being compressed; and the compressor circuit being synthesized performing:
mapping the plurality of scan chains into the plurality of groups of scan chains;
mapping the plurality of scan chains into a plurality of modes, wherein in one of the plurality of compressor design strategies said plurality of modes has at least two mode types, including:
primary modes associated with one group of scan chains of the plurality of groups of scan chains;
shrinking modes associated with an intersection of two or more groups of scan chains of the plurality of groups of scan chains; and
in at least one mode of the plurality of modes, selectively compressing the test responses from the plurality of groups of scan chains and a plurality of shift cycles by at least mapping the plurality of scan chains into a plurality of outputs of the compressor circuit, such that each of the scan chains is observable at more than one output of the plurality of outputs of the compressor circuit;
during testing, generating a subset of test patterns to detect a set of faults in the circuit under test targeting fault detection in a set of more restrictive modes of the plurality of modes wherein no more than one group of scan chains is selected for compression in each of the more restrictive modes;
identifying positions of unknown values in the test responses by simulating the subset of the test patterns; and
selecting a mode of the plurality of modes to detect any single error in test responses in one shift cycle of the plurality of shift cycles targeting fault detection in a set of less restrictive modes of the plurality of shift cycles targeting fault detection in a set of less restrictive modes of the plurality of modes wherein one or more groups of scan chains are selected for compression in each of the less restrictive modes.

19. A computer apparatus, comprising:
a computer to perform a method of compressing test responses of a circuit under test, the circuit under test including a plurality of scan chains which includes a plurality of known scan chains and a plurality of unknown scan chains, the method comprising:
synthesizing a compressor circuit of the circuit under test according to a selection from a plurality of compressor design strategies, the plurality of compressor design strategies having a varying sensitivity to a quantity of unknown values i) appearing in the test responses of the circuit under test and ii) being compressed; and the compressor circuit being synthesized performing:
mapping the plurality of scan chains into the plurality of groups of scan chains;
mapping the plurality of scan chains into a plurality of modes, wherein in one of the plurality of compressor design strategies said plurality of modes has at least two mode types, including:
primary modes associated with one group of scan chains of the plurality of groups of scan chains;
shrinking modes associated with an intersection of two or more groups of scan chains of the plurality of groups of scan chains; and
in at least one mode of the plurality of modes, selectively compressing the test responses from the plurality of groups of scan chains and a plurality of shift cycles by at least mapping the plurality of scan chains into a plurality of outputs of the compressor circuit, such that each of the scan chains is observable at more than one output of the plurality of outputs of the compressor circuit;

during testing, generating a subset of test patterns to detect a set of faults in the circuit under test targeting fault detection in a set of more restrictive modes of the plurality of modes wherein no more than one group of scan chains is selected for compression in each of the more restrictive modes;

identifying positions of unknown values in the test responses by simulating the subset of the test patterns; and selecting a mode of the plurality of modes to detect any single error in test responses in one shift cycle of the plurality of shift cycles targeting fault detection in a set of less restrictive modes of the plurality of modes wherein one or more groups of scan chains are selected for compression in each of the less restrictive modes.

* * * * *